United States Patent
Azuma et al.

(10) Patent No.: US 11,422,241 B2
(45) Date of Patent: Aug. 23, 2022

(54) PHOTODETECTOR AND DISTANCE MEASUREMENT APPARATUS COMPRISING PLURAL SINGLE PHOTON AVALANCHE DIODES WITH DIFFERENT RECOVERY TIME PERIODS

(71) Applicant: DENSO CORPORATION, Kariya (JP)

(72) Inventors: Kenta Azuma, Kariya (JP); Noriyuki Ozaki, Kariya (JP); Shinji Kashiwada, Kariya (JP); Teiyu Kimura, Kariya (JP); Isamu Takai, Aichi (JP); Hiroyuki Matsubara, Aichi (JP); Mitsuhiko Ohta, Aichi (JP); Shigeyoshi Hiratsuka, Aichi (JP)

(73) Assignee: DENSO CORPORATION, Kariya (JP)

( * ) Notice: Subject to any disclaimer, the term of this patent is extended or adjusted under 35 U.S.C. 154(b) by 484 days.

(21) Appl. No.: 16/584,093

(22) Filed: Sep. 26, 2019

(65) Prior Publication Data

US 2020/0018832 A1    Jan. 16, 2020

Related U.S. Application Data

(63) Continuation of application No. PCT/JP2018/013820, filed on Mar. 30, 2018.

(30) Foreign Application Priority Data

Mar. 31, 2017    (JP) .............................. JP2017-072504

(51) Int. Cl.
| | | |
|---|---|---|
| *H01L 31/107* | (2006.01) | |
| *G01S 7/4863* | (2020.01) | |
| *G01S 17/10* | (2020.01) | |

(52) U.S. Cl.
CPC ............ *G01S 7/4863* (2013.01); *G01S 17/10* (2013.01); *H01L 31/107* (2013.01)

(58) Field of Classification Search
CPC .......... G01S 17/00; G01S 17/10; G01S 17/14; G01S 7/483; G01S 7/486; H01L 31/107; H01L 31/02
USPC ................................... 250/214 R, 221, 214.1
See application file for complete search history.

(56) References Cited

U.S. PATENT DOCUMENTS 10,670,742 B2 *    6/2020    Jackson .................. G01T 1/248
2016/0371419 A1    12/2016    Dolinsky et al.

FOREIGN PATENT DOCUMENTS

| JP | 5644294 B2 | 12/2014 |
| JP | 2015117970 A | 6/2015 |
| JP | 2016145776 A | 12/2016 |
| JP | 2016225453 A | 12/2016 |

* cited by examiner

*Primary Examiner* — Que Tan Le
(74) *Attorney, Agent, or Firm* — Maschoff Brennan (57) ABSTRACT

A photodetector includes plural detectors. Each of the plural detectors has a single photon avalanche diode (hereinafter referred to as SPAD) which responds to incidence of a photon. The plural detectors include at least a first detector and a second detector. The SPAD has a recovery time period until the SPAD reaches a next photon-responsive state, in response to the SPAD responding to the incidence of the photon. The recovery time period of the SPAD in the first detector is different from the recovery time period of the SPAD in the second detector.

17 Claims, 5 Drawing Sheets

PHOTODETECTOR AND DISTANCE MEASUREMENT APPARATUS COMPRISING PLURAL SINGLE PHOTON AVALANCHE DIODES WITH DIFFERENT RECOVERY TIME PERIODS

CROSS REFERENCE TO RELATED APPLICATIONS

The present application is a continuation application of International Patent Application No. PCT/JP2018/013820 filed on Mar. 30, 2018, which designated the U.S. and claims the benefit of priority from Japanese Patent Application No. 2017-072504 filed on Mar. 31, 2017. The entire disclosures of all of the above applications are incorporated herein by reference.

TECHNICAL FIELD

The present disclosure relates to a photodetector and a distance measurement apparatus.

BACKGROUND

In a related art, a photodetector operates an avalanche photodiode (hereinafter referred to as APD) in Geiger-mode to perform photodetection. In other words, the photodetector utilizes an avalanche effect. The APD operating in Geiger-mode is called a single photon avalanche diode (hereinafter referred to as SPAD), and operates with an application of a voltage higher than a breakdown voltage as a reverse bias voltage.

SUMMARY

The present disclosure describes a photodetector including plural detectors each having an SPAD, and a distance measurement apparatus including the photodetector.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

When a photon is incident on a SPAD and then the SPAD has a response, a breakdown occurs at the SPAD. Therefore, the SPAD includes a recharge controller configured to recharge the SPAD after the response. The recharge controller is a so-called quench resistor, and includes a resistor or a semiconductor such as a metal-oxide semiconductor field-effect transistor (hereinafter referred to as MOSFET).

The recharge controller outputs a detected signal based on a flowing current due to having a breakdown occurred at the SPAD, and stops the SPAD to make a response due to a voltage drop caused by the current to recharge the SPAD.

The SPAD is recharged immediately after the response. When the photodetection is enabled, carriers trapped in crystal defects or the like may generate a pseudo response, which is independent of light incidence. Therefore, it may be necessary to set a predetermined dead time after the response.

In a situation where this type of photodetector is utilized in a distance measurement apparatus such as vehicle-mounted radar, the dead time may be a reason that lowers a responsive state of distance measurement. In this type of photodetector, plural SPADs are included in one pixel for photodetection. The total number of SPADs that have respectively made responses is counted in each predetermined measurement time. It is determined that light is incident on the pixel when the total number is larger than or equal to a predetermined threshold value.

With regard to the photodetector in a related art, in a normal state in which the plural SPADs respectively make responses at random times due to noise such as a pseudo response, the total number of SPADs having a response within the measurement time is smaller. Therefore, the light incidence may be detected without being affected by the noise.

However, the present inventor found out that, when the plural SPADs respectively make responses simultaneously, an erroneous photodetection may occur due to an increase in the total number of SPADs respectively having pseudo responses that may lower detection accuracy.

For example, in a situation where light, which is irradiated toward the measurement target, is incident as a clutter on the photodetector or in a situation where strong reflected light is incident on the photodetector from a highly reflective object, the plural SPADs in one pixel may respectively make responses simultaneously in a distance measurement apparatus.

In this situation, the plural SPADs simultaneously respond to strong light and then many of the plural SPADs respectively have pseudo responses substantially at the same time. Thus, light input may be erroneously detected due to the pseudo responses, which may lower the detection accuracy.

In one or more embodiments of the present disclosure, a photodetector includes the plural SPADs. Each of the plural SPADs responds to photon incidence. It is possible to improve the detection accuracy by decreasing the total number of the SPADs that respectively have pseudo responses, after the plural SPADs make the response simultaneously.

A photodetector according to an aspect of the present disclosure includes plural detectors. The plural detectors include at least a first detector and a second detector. Each of the plural detectors has a SPAD that is configured to respond to incidence of a photon. The corresponding SPAD has a recovery time period until the corresponding SPAD reaches a next photon-responsive state, in response to the corresponding SPAD responding to the incidence of the photon. The recovery time period of the SPAD in the first detector is different from the recovery time period of the SPAD in second detector.

Therefore, the total number of SPADs that respectively have pseudo responses simultaneously may decrease, after strong light is incident on the photodetector and then the SPADs in the respective detectors have responses simultaneously. Therefore, it is possible to inhibit a situation in which the detection accuracy is lowered by a pseudo response made by the SPAD, with the use of the photodetector according to the present disclosure to detect photon incidence based on the total number of SPADs that respectively have made responses.

The following describes several embodiments of the present disclosure with reference to drawings.

First Embodiment

Figure 1:
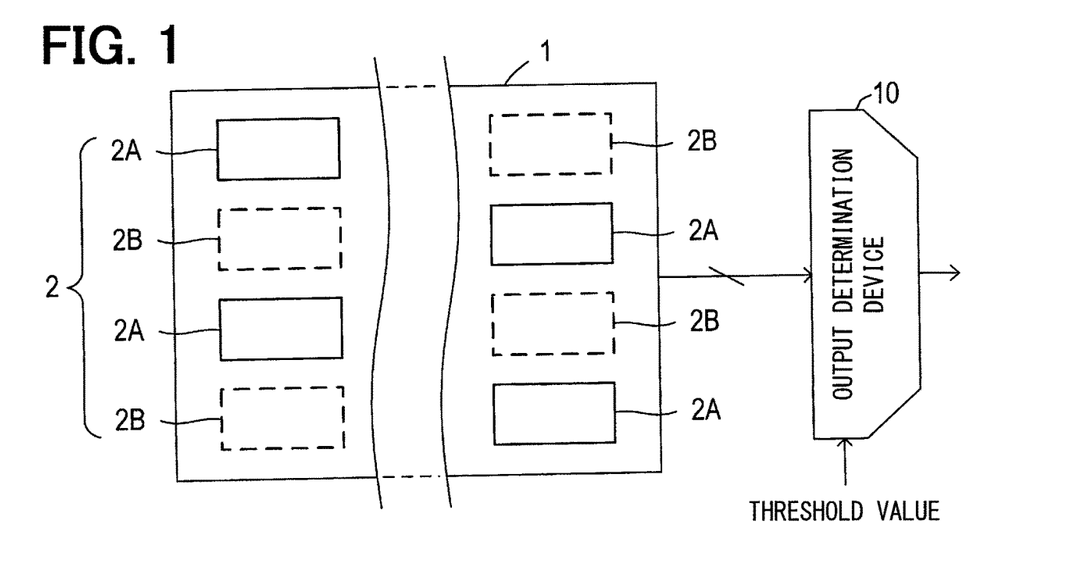
FIG. 1 illustrates a schematic configuration of a photodetector according to a first embodiment.

As shown in FIG. 1, a photodetector 1 according to the present embodiment includes plural detectors 2 arranged in a grid shape having a longitudinal direction and a latitudinal direction. Each of the detectors 2 detects photon incidence. The photodetector 1 is configured as a light receiving array included in one pixel.

Figure 2:
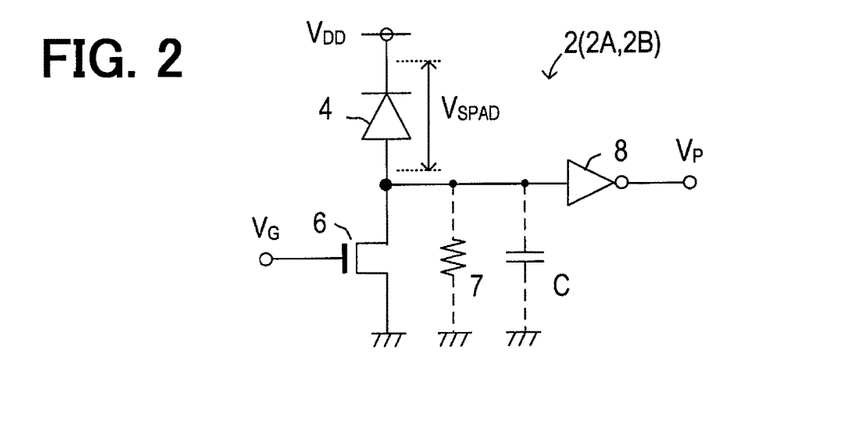
FIG. 2 is a circuit diagram that shows a configuration of a detector included in the photodetector according to the first embodiment.

As shown in FIG. 2, each detector 2 includes a SPAD 4. When a photon is incident on the SPAD 4, the detector 2 outputs a digital pulse Vp as a pulse signal having a predetermined pulse width from a pulse output device 8.

An output determination device 10 is connected to the photodetector 1. The output determination device 10 determines that light is detected at the pixel including the photodetector 1 and then outputs a trigger signal, when the total number of pulse signals simultaneously output from the respective detectors 2 is counted and the count value is larger than or equal to a predetermined threshold value.

The plural detectors 2 in the photodetector 1 are divided into two different groups A and B, which respectively have different recovery time periods until reaching a responsive state after the plural detectors 2 respectively make responses to photon incidence.

The number of detectors 2A in group A is substantially identical to the number of detectors 2B in group B. The detectors 2A, 2B are distributed and disposed evenly in the respective groups 2A, 2B on a light receiving surface of the photodetector 1 that receives light. In particular, the detectors 2A, 2B are disposed alternatively in the longitudinal and the lateral directions on the light receiving surface. In other words, the detectors 2A, 2B are not disposed continuously in the longitudinal and lateral directions. The detectors 2A,2B are disposed to form a checkered pattern.

The following describes the configurations of the respective detectors 2A, 2B with reference to FIG. 2.

As shown in FIG. 2, the basic configurations of the respective two types of detectors 2A,2B are identical. Each of the configurations includes the SPAD 4, a quench resistor 6 and the pulse output device 8.

The SPAD 4 is an avalanche photodiode to be operated in Geiger-mode. The quench resistor 6 is connected in series with a conduction path leading to the SPAD 4.

The quench resistor 6 generates a voltage drop caused by a current flowing through the SPAD 4, when a photon is incident on the SPAD 4 and then a breakdown occurs at the SPAD 4. Thus, the quench diode 6 stops the Geiger discharge of the SPAD 4. In the present embodiment, the quench resistor 6 includes a MOSFET.

In the present embodiment, a predetermined gate voltage $V_G$ is applied to the MOSFET included in the quench resistor 6 to turn on the MOSFET. The MOSFET is operated as the quench resistor 6 through the on-resistance. Therefore, it may be possible to apply a reverse bias voltage to the SPAD 4. Additionally, it may be possible to block the conduction path leading to the SPAD 4 and stop the operation of the SPAD 4 by stopping an application of the gate voltage $V_G$.

A voltage across both ends of the quench resistor 6 is input to the pulse output device 8. The pulse output device 8 detects a current flowing at a time of the SPAD 4 responding to the photon incidence based on the voltage across both ends of the quench resistor 6. The pulse output device 8 outputs the digital pulse Vp as a detected signal when the voltage is larger than or equal to a threshold voltage.

Figure 3:
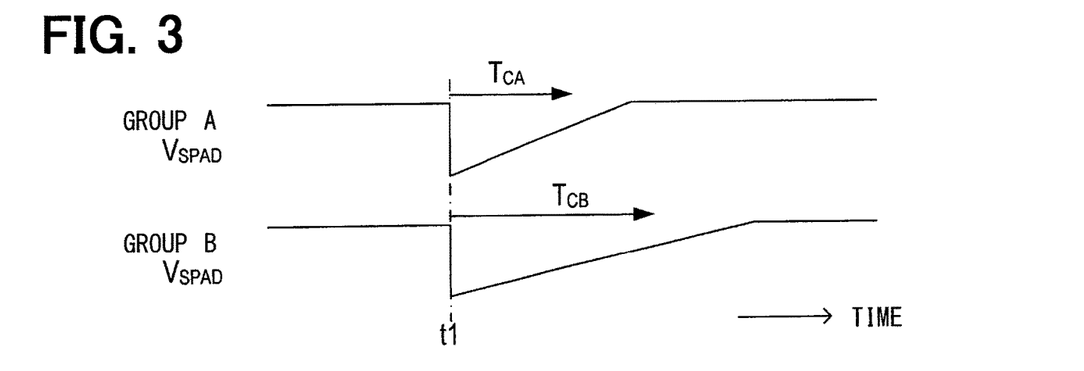
FIG. 3 is a time chart that shows a recharge state of SPAD included in the detector according to the first embodiment.

The SPAD 4 has an anode connected to a ground line through via the quench resistor 6, and has a cathode connected to a power supply line. As shown in FIG. 3, a voltage $V_{SPAD}$ across both ends of the SPAD 4 reaches an initial voltage, which corresponds to a power supply voltage $V_{DD}$ supplied from the power line, in an initial state before a photon is incident on the SPAD 4.

In a state where a voltage is applied to the SPAD 4, when a photon is incident on the SPAD 4 at time t1 shown in FIG. 3, a breakdown occurs at the SPAD 4 and then a current flows through the quench resistor 6. Since a voltage drop occurs at the quench resistor 6, the voltage $V_{SPAD}$ across both ends once decreases. Subsequently, the voltage $V_{SPAD}$ across both ends rises as the SPAD 4 is recharged through the quench resistor 6, and the SPAD 4 is recovered to an initial voltage that is responsive to photon incidence.

Accordingly, the SPAD 4 is insensitive to photon incidence after the SPAD 4 have a response to photon incidence until the SPAD 4 is recharged via the quench resistor 6. If a charge time period required to recharge the SPAD 4 is identical in each of the detectors 2A, 2B in the photodetector 1, the recovery time period from a moment where the detector 2 making a response to the photon incidence until a moment of reaching the next responsive state is also identical in each of the detectors 2A, 2B.

As a result, when strong light to which most of the plural detectors 2A, 2B respectively have responses is incident on the photodetector 1, pseudo responses may occur substantially at the same time in the respective detectors 2A, 2B after having the responses to the strong light. In this situation, an erroneous detection due to the pseudo responses may occur in the output determination device 10.

In the present embodiment, the plural detectors 2 in the photodetector 1 are divided into two groups A and B. As shown in FIG. 3, the recharge time period $T_{CA}$ of the SPAD 4 in the detectors 2A of the group A is different from the recharge time period $T_{CB}$ of the SPAD 4 in the detector 2B of the group B.

In particular, in the present embodiment, when the size of the MOSFET in the quench resistor 6 as a recharge controller in the present disclosure is changed, it may be possible to differentiate the recharge current flowing through the MOSFET in each of the detectors 2A and 2B.

In other words, in the present embodiment, the recharge current may be controlled by changing a saturation current of the MOSFET in the quench resistor 6. Thus, it may be possible to differentiate the recharge time periods $T_{CA}$ of the SPAD 4 in the detector 2A from the recharge time period $T_{CB}$ of the SPAD 4 in the detector 2B.

According to the photodetector 1 in the present embodiment, the strong light is incident on the photodetector 1 and then the plural SPADs 4 in the photodetector 1 respectively have responses substantially at the same time. It may be possible to shift the timing of a pseudo response occurred in each of the detectors 2A, 2B in the respective groups A, B subsequently. It may be possible to inhibit an erroneous detection of light incidence at the output determination device 10, when the plural SPADs 4 in the photodetector 1 respectively have pseudo responses substantially at the same time.

As in the present embodiment, for setting the respective charge times of the SPADs 4 in the corresponding detectors 2A, 2B to be different from each other, it may be unnecessary to change the size of the MOSFET in the quench resistor 6. The following may also be applicable.

(1) In a situation where the quench resistor 6 includes the MOSFET, an on-resistance may be adjusted by the gate voltage $V_G$ of the MOSFET. Thus, it may be possible to set the respective recharge time periods $T_{CA}$, $T_{CB}$ to be different from each other by changing the respective gate voltages $V_G$ of the MOSFETs in the corresponding detectors 2A and 2B.

(2) The quench resistor 6 may include a resistive component such as a resistor or a wiring resistor as shown by a dotted line in FIG. 2. Accordingly, in this situation, a resistance value of the resistive component 7 is set to be a different value in each of the detectors 2A, 2B. Thus, it may be possible to set the respective recharge time periods $T_{CA}$, $T_{CB}$ to be different from each other.

(3) The quench resistor 6 may include the MOSFET or the resistor. The quench resistor 6 functions as a recharge controller in the present disclosure. The amount of current required to recharge the SPAD 4 through the recharge controller varies based on the SPAD 4 or a parasitic capacitance C in the recharge controller as shown by a dotted line in FIG. 2.

It may be possible to change the amount of current required to recharge the SPAD 4 through the quench resistor 6 by adjusting the parasitic capacitance C or providing a separate capacitor.

With the use of the parasitic capacitance or the capacitance value of a capacitor, it may be possible to set the respective recharge time periods $T_{CA}$, $T_{CB}$ to be different from each other by changing the amount of current required to recharge the SPAD 4. The configuration in which the MOSFETs have different size and the respective configurations of the above-mentioned (1) to (3) may be implemented in combination as appropriate. With these configurations, it may be possible to restrict the SPADs 4 to simultaneously have the respective responses by changing the respective recharge time periods. Thus, it may be possible to improve the detection accuracy of the output determination device 10

In the present embodiment, the detectors 2 in the photodetector 1 are divided into two groups A, B, and the recharge time period of the SPAD 4 in the detector 2 is set for each of the groups A, B.

This grouping is merely one example. For instance, the detectors 2 may also be divided into more groups, and the recharge time period may be set for each of the groups. Alternatively, the recharge time period of the SPAD 4 may be set to be distinct for all of the detectors 2 in the photodetector 1.

In any situations, each of the detectors 2 may be evenly disposed to differentiate the recharge time period of the SPAD 4 in the detector 2 from that of the SPAD 4 in the adjacent detector 2.

Second Embodiment

In the first embodiment, the respective recharge time periods of the SPADs 4 in the corresponding plural detectors 2 are varied to be different from each other. Thus, the recovery time period from the moment where each detector 2 has a response to photon incidence to the moment where the detector 2 reaches the next responsive state may be varied.

It is unnecessary to vary the recharge time period of the SPAD 4 for changing the recovery time period. For changing the recovery time period, a time period from a moment where the SPAD 4 has a response until a moment where a recharge is started may be varied.

Figure 5:
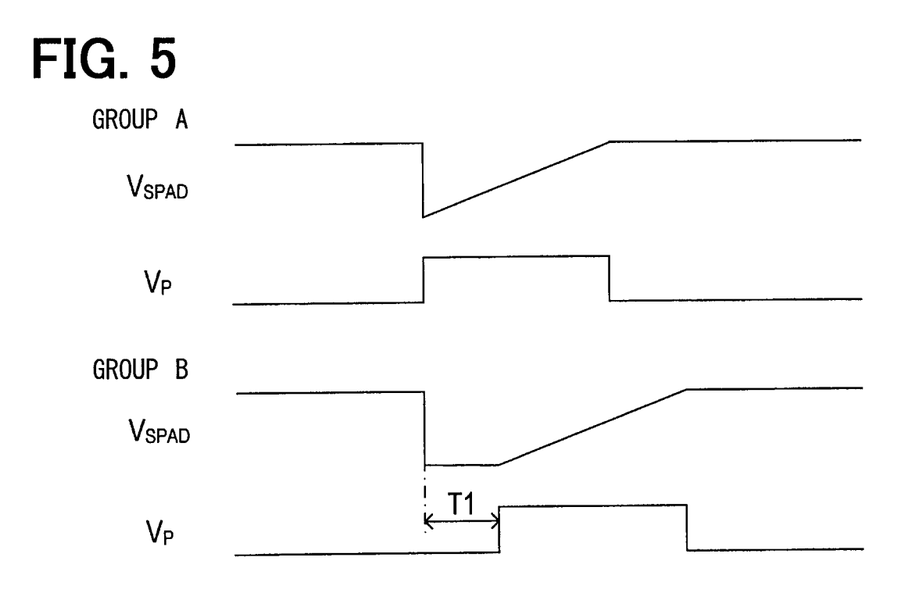
FIG. 5 is a time chart that shows a recharge state of SPAD for configuring the detector according to the second embodiment.

In the second embodiment, the plural detectors 2 are also divided into two groups A, B as in the first embodiment. As shown in FIG. 5, for the detector 2B in the group B, the start of recharging the SPAD 4 is delayed for a predetermined time period T1 (or a first time period) after the SPAD 4 has a response.

Figure 4:
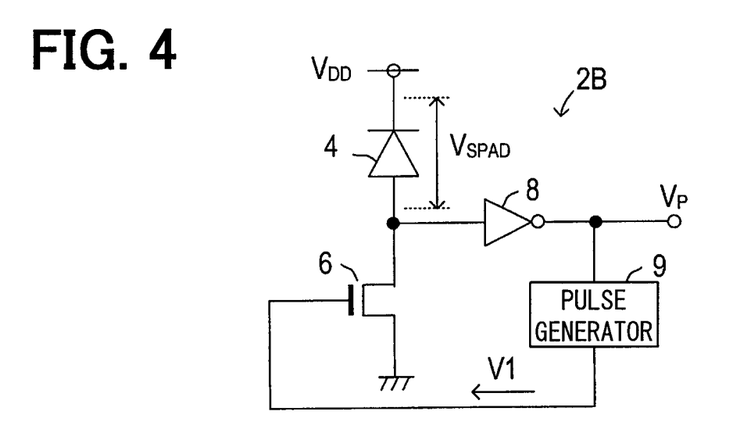
FIG. 4 is a circuit diagram that shows a configuration of a detector in group B according to a second embodiment.

For example, as shown in FIG. 4, a pulse generator 9 is provided at the detector 2B in the group B. When the digital pulse Vp is output from the pulse output device 8, the pulse generator 9 generates a delay pulse V1 after the predetermined time period T1 has been elapsed.

The delay pulse V1 from the pulse generator 9 is applied to the gate of the MOSFET in the quench resistor 6 for starting the recharge of the SPAD 4.

Accordingly, the timing for starting the recharge of the SPAD 4 after the SPAD 4 having a response is delayed for the detector 2B in the group B.

Even if the photodetector is configured as described above, the time period for recharging the SPAD 4 after the SPAD 4 having a response is different in each of the detectors 2A, 2B. Thus it may be possible to inhibit a situation where the SPADs 4 in the respective detectors 2A, 2B simultaneously reach the responsive state.

In the present embodiment, it may be possible to inhibit a situation where light incidence may be erroneously detected at the output determination device 10, when the plural SPADs 4 in the photodetector 1 respectively have pseudo responses substantially at the same time.

In the present embodiment, the pulse generator 9 for delaying the start time for recharging the SPAD 4 is provided at the detector 2B in the group B. The pulse generator 9 may also be provided at each of all of the detectors 2.

In this situation, the respective recovery time periods of the SPADs 4 in the corresponding detectors 2 may be finely changed, by providing the pulse generator 9 to set the delay time period T1 distinctively at each group, which is obtained by dividing the plural detectors 2 into three or more groups, or each of all of the detectors 2.

Third Embodiment

The first and second embodiments vary the respective recharge time period or the recharge starting time of the SPAD 4 in each of the plural detectors 2. Thus, the recovery time period of the SPAD 4 is varied.

It is possible to inhibit a situation where the detected signals caused by respective pseudo responses of the SPADs 4 in the corresponding detectors 2 are output simultaneously in order to inhibit a situation where light incidence on the photodetector 1 is erroneously detected at the output determination device 10. Therefore, it is unnecessary to vary the recovery time period of the SPAD 4.

Figure 6:
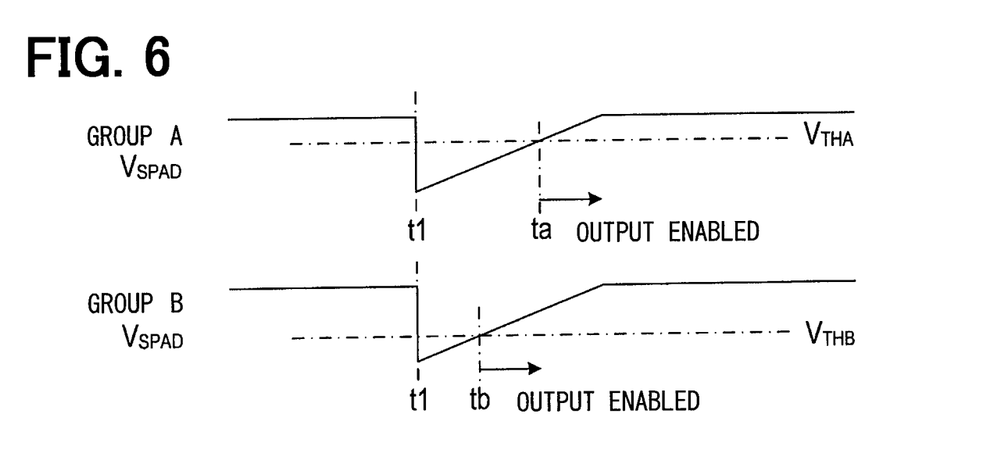
FIG. 6 is a time chart that shows a threshold value of a pulse output device included in a detector according to a third embodiment and a recovery time.

In other words, as shown in FIG. 6, the respective time periods, which is from a time point t1 to a time point ta and from the time point t1 to a time point tb, may be set to be different for the detectors 2A, 2B in the corresponding groups A, B. The SPAD 4 has a response and outputs the digital pulse Vp at the time point t1. The SPAD 4 may output the next digital pulse Vp at the time points ta, tb.

In particular, threshold voltages $V_{THA}$, $V_{THB}$ of the respective pulse output devices 8 provided at the detectors 2A, 2B in the corresponding groups A, B may be set to different voltage values. According to this configuration, it may be possible to inhibit a situation where the digital pulses Vp are respectively output from the detectors 2A, 2B simultaneously due to the SPADs respectively having pseudo responses, after the SPADs 4 in the respective detectors 2A, 2B have responses simultaneously and then output the digital pulses Vp as detected signals.

Accordingly, in the present embodiment, it is also possible to inhibit a situation where light incidence is erroneously detected by the output determination device 10, when the plural SPADs 4 in the photodetector 1 respectively have pseudo responses substantially at the same time.

The threshold voltage of the pulse output device 8 may be set to be distinct in each of the groups obtained by dividing the plural detectors 2 into three or more groups. Alternatively, the threshold voltage of the pulse output device 8 may be set to a distinct voltage value for all of the detectors 2.

Fourth Embodiment

In the first to third embodiments, the respective recharging time periods or the respective recharge starting times of the SPADs 4 in the corresponding plural detectors 2 may be varied, or the time period from a moment where a detected signal is output until a moment where the following detected signal is output may be varied. Thus, the recovery time of the SPAD 4 or the detector 2 may be varied.

Accordingly, in a case where the photodetector 1 in each of the embodiments is utilized, it is possible to inhibit a situation where the output determination device 10 has an erroneous detection of light incidence on the photodetector 1 and outputs a signal indicative of light incidence on the photodetector 1, when the SPADs 4 in the respective detectors 2 respectively have pseudo responses.

However, in a case where the power supply voltage $V_{DD}$ is applied to the SPADs 4 in the corresponding detectors 2 simultaneously at the starting time of driving the photodetector 1, it may be perceived that there are more SPADs 4 than usual being charged to be completed substantially at the same time. When many SPADs 4 respectively have responses substantially at the same time, the output determination device 10 may have an erroneous detection of photon incidence on the photodetector 1.

When the photodetector 1 starts to be driven in each of the embodiments, it may be possible to control start timing of driving each of the SPADs 4 so that each of the SPADs 4 may respond to photon incidence at different timing in the detector 2. In the fourth embodiment, a distance measurement apparatus 20 is described.

The distance measurement apparatus 20 controls start timing of driving the SPAD 4 in each of the plural detectors 2 at the starting time of driving the photodetector 1. Thus, it may be possible to inhibit a situation where many SPADs 4 respectively have responses immediately after the start of driving the photodetector 1.

Figure 7:
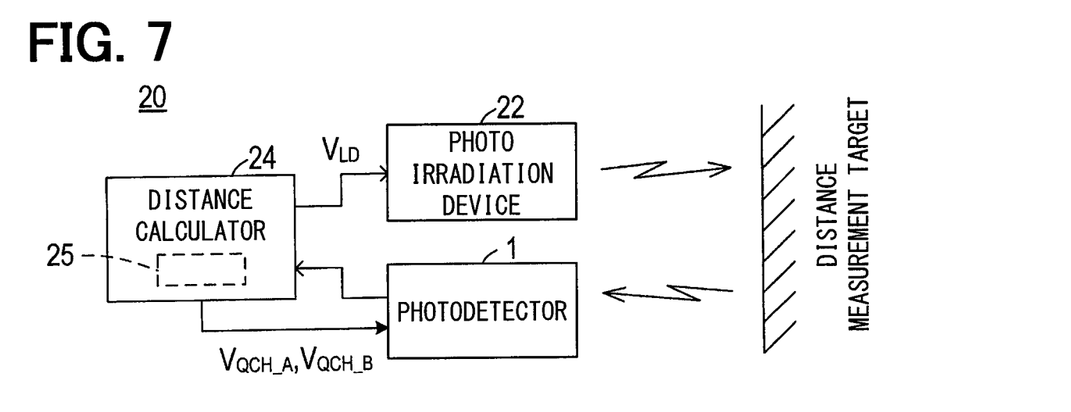
FIG. 7 is a block diagram that shows a configuration of a distance measurement apparatus according to a fourth embodiment.

As shown in FIG. 7, the distance measurement apparatus 20 in the present embodiment includes the photodetector 1, a photo irradiation device 22 configured to project signal light for measuring distance toward a distance measurement target, and a distance calculator 24.

Figure 8:
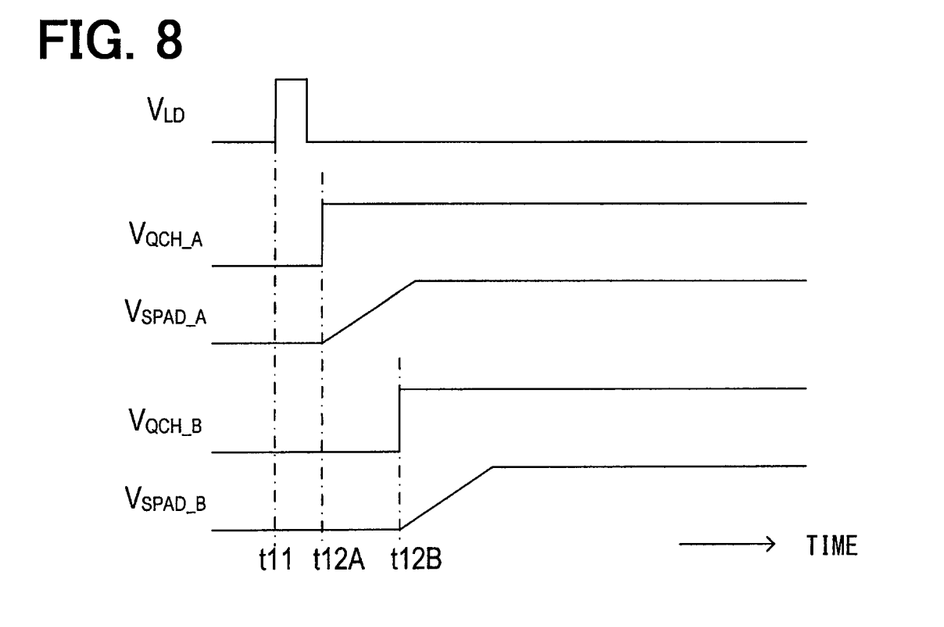
FIG. 8 is a time chart that shows irradiation timing of the distance measurement apparatus and start timing of driving the photodetector.

The distance calculator 24 measures a time period, which corresponds to a third period, from a moment where the photo irradiation device 22 irradiates signal light and then the signal light reflects at an object as a measurement target until a moment where the reflected light is received at the photodetector 1, and then the distance calculator 24 measures a distance to the object based on the measured time period. The photodetector 1 is the one described in each of the first to third embodiments. The photodetector 1 outputs a detected signal to the distance calculator 24 through the output determination device 10. The distance calculator 24 initially outputs a driving signal $V_{LD}$ to the photo irradiation device 22 at the time point t11 to project the signal light. Subsequently, the distance calculator 24 outputs respective driving signals $V_{QCH\_A}$, $V_{QCH\_B}$ to the detectors 2A, 2B in the corresponding groups A, B at the respective time points t12A, t12B.

The driving signals $V_{QCH\_A}$, $V_{QCH\_B}$ cause the respective MOSFETs as the quench resistors 6 to turn on, and then a reverse bias voltage is applied to the SPAD 4 in each of the detectors 2A, 2B to charge the SPAD 4.

In the present embodiment, the distance calculator 24 projects the signal light on the light irradiation device 22, and then the distance calculator 24 sequentially raises the driving signals $V_{QCH\_A}$, $V_{QCH\_B}$. Even when the signal light from the photo irradiation device 22 reflects inside the device and is incident on the photodetector 1 as cluttered light, it may be possible to inhibit a situation where the plural SPADs 4 respectively have responses simultaneously due to the cluttered light and a detected signal is output from the photodetector 1 to the distance calculator 24.

A time period (or a second time period), which is after the start of distance measurement until a moment where the SPAD 4 is charged and reaches a photon responsive state, is distinct due to the difference of input timing of the driving signals $V_{QCH\_A}$, $V_{QCH\_B}$ respectively input at the detectors 2A, 2B in the corresponding groups A and B of the photodetector 1.

According to the present embodiment, it may be possible to inhibit a situation where the plural SPADs 4 reach the responsive state simultaneously after the start of driving the photodetector 1. Therefore, it may be possible to inhibit a situation where many digital pulses Vp are output from the respective plural detectors 2 in the photodetector 1 immediately after the start of driving the photodetector 1, and a detected signal is output from the output determination device 10 to the distance calculator 24.

Figure 9:
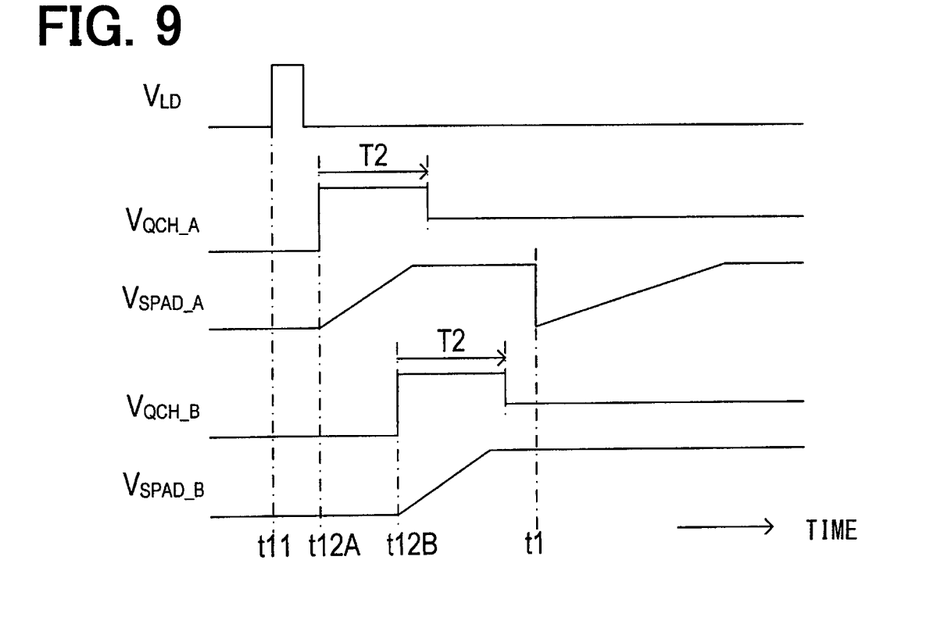
FIG. 9 is a time chart that shows a state of changing a recharge time period for the SPAD by a driving voltage of the photodetector immediately after the drive and after a response.

As shown in FIG. 9, the distance calculator 24 projects a signal light on the photo irradiation device 22, and then the distance calculator 24 raises the respective driving signals $V_{QCH\_A}$, $V_{QCH\_B}$ at time points t12A, t12B, and the voltage values are lowered after a predetermined time period T2 has been elapsed after the time points t12A, t12B.

The SPAD 4 in each of the detectors 2A, 2B is charged in a shorter time immediately after the start of driving the photodetector 1, and is possible to respond to photon incidence. Subsequent to the response, the gate voltage of the MOSFET may be set to vary a time for charging the SPAD 4.

In a situation where the photodetector 1 starts driving and the timing, at which the plural SPADs 4 reach the responsive state, is controlled, it may be possible to control the timing for each group, which is obtained by dividing the plural detectors 2 into three or more groups. It may also be possible to control the timing, at which the SPAD 4 reaches the responsive state, to be distinct for all the detectors 2.

First Modification

Figure 10A:
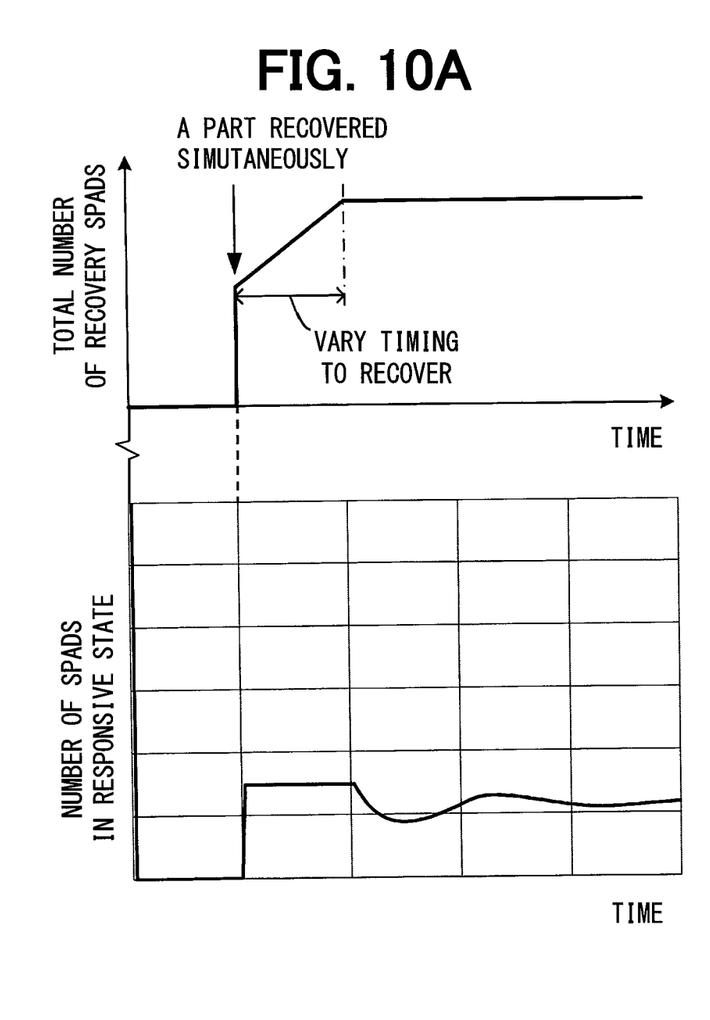
FIG. 10A illustrates a change in the total number of SPADs reaching a responsive state after driving the photodetector and a change in the number of SPADs at a time of varying recovering period for the SPADs.

In particular, as shown in FIG. 10A, to bring the total number of SPADs 4 reaching the responsive state after the start of driving the photodetector 1 closer to the usual number of SPADs 4 after the start of driving the photodetector 1, it may be possible to operate the plural detectors 2 in the photodetector 1.

In other words, the plural detectors 2 in the photodetector 1 are divided into two groups. A driving signal is input to the detectors 2 in one of the groups simultaneously so that the SPADs 4 return to the responsive state simultaneously.

After the driving signal is input to the detectors 2 in one of the groups, the driving signal is sequentially input to the detectors 2 in the other group at arbitrary time intervals. Thus, it may be possible to vary the timing in which the plural SPADs 4 in the corresponding detectors 2 reach the responsive state.

Therefore, it may be possible to lower the number of SPADs 4 that may respond after the start of driving the photodetector 1, and subsequently it may be possible to inhibit a situation where the number of SPADs 4 in the responsive state fluctuates. For this reason, when light is actually incident on the photodetector 1 and the number of SPADs 4 that actually respond increases, it may be possible that the output determination device 10 determines light incidence with higher accuracy.

Figure 10B:
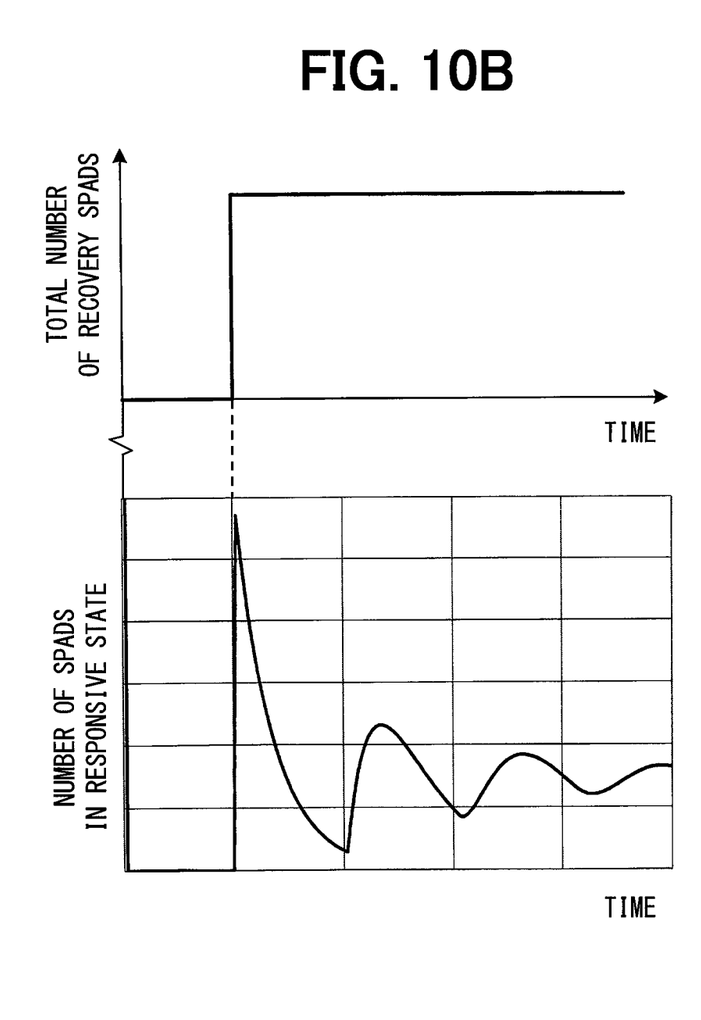
FIG. 10B illustrates a change in the total number of SPADs reaching a responsive state after driving the photodetector and a change in the number of SPADs at a time of recovering the SPADs all together simultaneously.

In other words, as shown in FIG. 10B, when the driving signal is simultaneously input to the plural detectors 2 in the photodetector 1 and all of the SPADs 4 are recovered simultaneously, the number of SPADs in the responsive state increases immediately after the driving of the photodetector 1. Thus, the number of SPADs in the responsive state increases and decreases periodically due to a pseudo response or the like.

On the other hand, when the plural SPADs 4 are recovered as described in the first modification, the number of the SPADs 4 that may respond to a photon is averaged after the start of driving the photodetector 1. Therefore, it may be possible to improve the accuracy of determining photon incidence performed by the output determination device 10.

Second Modification

On the other hand, the distance calculator 24 performs a measurement operation plural times, and then calculates a distance to the object by adding up the measurement results obtained plural times. In the measurement operation, a time period (or a third time period), from a moment where the signal light is projected from the photo irradiation device 22 to a moment where the photodetector 1 receives the reflected light is measured.

In this situation, as shown by a dotted line in FIG. 7, a timing controller 25 is provided at the distance calculator 24. Therefore, it may be possible that the timing controller 25 changes a timing of the start of driving the photodetector 1 in each measurement operation. In other words, it may be possible to change a time period (or a fourth period) from a moment where the photo irradiation device 22 projects signal light until a moment of the start of driving the photodetector 1 in each measurement operation.

In a situation where the number of SPADs in the responsive state varies after the start of driving of the photodetector 1, a variation in the number of SPADs in the responsive state during an elapsed time period (or a fourth time period) from the photo irradiation device 22 projecting signal light is distinct in each measurement operation.

It may be possible to inhibit the influence of a variation in the number of SPADs in the responsive state after the start of driving by adding up plural measurement results. Even though the timing of starting the drive of the plural detectors 2 in the photodetector 1 is not varied, it may also be possible to obtain the similar effects.

Although embodiments of the present disclosure have been described above, the present disclosure may not be limited to the above-described embodiments, and various modifications may also be made. For example, in the fourth embodiment, the distance measurement apparatus 20 measures a distance to an object as a measurement target with the use of the photodetector 1 in the present disclosure. The photodetector 1 in the present disclosure may not only be limited to be applied to the distance measurement apparatus 20, but may also be applied to a variety of devices in which photodetection is needed.

In this situation, when the photodetector 1 is driven, it may be possible that the distance calculator 24 in the fourth embodiment inputs a driving signal to each of the detectors 2 at different timing. Therefore, it may be possible to increase the determination accuracy of light incidence in the output determination device 10.

Plural functions of one element in the above embodiment may be implemented by plural elements, or one function of one element may be implemented by plural elements. In addition, plural functions of multiple components may be realized by one component, or a single function realized by plural components may be realized by one component. A part of the configuration of the above embodiment may be omitted. At least a part of the configuration of the above embodiments may be added to or replaced with the configuration of another one of the above embodiments.

What is claimed is:

1. A photodetector comprising:
   a plurality of detectors, each detector having a single photon avalanche diode (SPAD) that is configured to respond to incidence of a photon,
   wherein the plurality of detectors include at least a first detector and a second detector,
   wherein each SPAD has a recovery time period until the corresponding SPAD reaches a next photon-responsive state, in response to the corresponding SPAD responding to the incidence of the photon, and
   wherein the recovery time period of the SPAD in the first detector is different from the recovery time period of the SPAD in the second detector.

2. The photodetector according to claim 1,
wherein each of the detectors includes a recharge controller that is configured to recharge the SPAD for recovering the corresponding SPAD to enable the corresponding SPAD responding to the incidence of the photon, in response to the corresponding SPAD responding to the incidence of the photon, and
wherein the first detector is set, by the recharge controller, to have the recovery time period of the SPAD in the first detector to be different from the recovery time period of the SPAD in the second detector.

3. The photodetector according to claim 2,
wherein the recharge controller includes a semiconductor device that is configured to control a current flowing through the SPAD, and
wherein the first detector is set, by the current flowing through the semiconductor device, to have the recovery time period of the SPAD to be different from the recovery time period of the SPAD in the second detector.

4. The photodetector according to claim 2,
wherein the recharge controller includes a resistor that is disposed at a conduction path to the SPAD, and
wherein the first detector is set, based on a resistance value of the resistor, to have the recovery time period of the SPAD to be different from the recovery time period of the SPAD in the second detector.

5. The photodetector according to claim 2,
wherein the recharge controller provides an amount of a current required to recharge the SPAD, and
wherein the first detector is set, based on the amount of the current, to have the recovery time period of the SPAD to be different from the recovery time period of the SPAD in the second detector.

6. The photodetector according to claim 2,
wherein the first detector is configured to be different from the second detector based on a first time period, which is until the recharge controller starts recharging the SPAD in response to the SPAD responding to the incidence of the photon.

7. The photodetector according to claim 1,
wherein each of the detectors includes a pulse output device configured to perform level comparison between an output of the SPAD and a threshold voltage to output a digital pulse as a detected signal of the photon.

8. The photodetector according to claim 7,
wherein the first detector is configured to be different from the second detector based on the threshold voltage of the pulse output device.

9. The photodetector according to claim 1,
wherein the detectors are divided into a plurality of groups based on the recovery time period of the SPAD, and
wherein the detectors in each of the groups are evenly disposed on a light receiving surface to receive light.

10. The photodetector according to claim 1,
wherein the first detector is controlled to have a timing, at which the SPAD is responsive to the incidence of the photon in response to the photodetector starting to be driven, different from the timing in the second detector.

11. The photodetector according to claim 10,
wherein the detectors are divided into a first group and a second group,
wherein the detectors in the first group are controlled to have identical timings at which the SPAD is responsive to the incidence of the photon in response to the photodetector starting to be driven, and
wherein the detectors in the second group are controlled to have different timings at which the SPAD is responsive to the incidence of the photon in response to the photodetector starting to be driven.

12. The photodetector according to claim 1,
wherein the first detector is controlled to have a second time period shorter than the recovery time period,
wherein the second time period is from the photodetector starting to be driven until the SPAD being responsive to the incidence of the photon.

13. The photodetector according to claim 1, further comprising:
an output determination device configured to output a signal representing light detected at a pixel configured by the detectors, in response to a total number of signals respectively output from the detectors being larger than or equal to a threshold value.

14. A distance measurement apparatus, comprising:
the photodetector according to claim 1;
a photo irradiation device configured to project signal light; and
a distance calculator that is configured to measure a third time period to calculate a distance to an object based on the third time period,
wherein the third time period is from the photo irradiation device projecting the signal light and then the signal light being reflected at an object until the photo irradiation device receiving the signal light.

15. The distance measurement apparatus according to claim 14,
wherein the distance calculator is configured to start driving the photodetector after the photo irradiation device projects the signal light.

16. The distance measurement apparatus according to claim 15,
wherein the distance calculator is configured to perform a measurement operation for measuring the third time period with a plurality of occurrences, and is configured to change a fourth time period in each of the occurrences, and
wherein the fourth time period is from the photo irradiation device projecting the signal light until the photodetector starting to be driven.

17. The photodetector according to claim 1, further comprising:
a light receiving surface to receive light,
wherein the detectors are divided into a plurality of groups based on the recovery time period of the SPAD, and
wherein the detectors in each of the groups are evenly disposed on the light receiving surface.

* * * * *